(12) United States Patent
Baek

(10) Patent No.: US 12,105,133 B2
(45) Date of Patent: Oct. 1, 2024

(54) METHOD FOR FABRICATING TEST SOCKET

(71) Applicant: LEENO INDUSTRIAL INC., Busan (KR)

(72) Inventor: Seungha Baek, Busan (KR)

(73) Assignee: LEENO INDUSTRIAL INC., Busan (KR)

( * ) Notice: Subject to any disclaimer, the term of this patent is extended or adjusted under 35 U.S.C. 154(b) by 0 days.

(21) Appl. No.: 17/768,763

(22) PCT Filed: May 18, 2021

(86) PCT No.: PCT/KR2021/006236
§ 371 (c)(1),
(2) Date: Apr. 13, 2022

(87) PCT Pub. No.: WO2021/235842
PCT Pub. Date: Nov. 25, 2021

(65) Prior Publication Data
US 2024/0110947 A1    Apr. 4, 2024

(30) Foreign Application Priority Data
May 22, 2020   (KR) .................. 10-2020-0061448

(51) Int. Cl.
*G01R 3/00*      (2006.01)
*G01R 1/04*      (2006.01)
*G01R 1/073*     (2006.01)

(52) U.S. Cl.
CPC .............. *G01R 3/00* (2013.01); *G01R 1/045* (2013.01); *G01R 1/07314* (2013.01)

(58) Field of Classification Search
CPC ....... G01R 3/00; G01R 1/045; G01R 1/07314
See application file for complete search history.

(56) References Cited

U.S. PATENT DOCUMENTS

2001/0021807 A1\* 9/2001 Saito .................. G10K 11/02
                                                            600/459
2003/0052703 A1  3/2003 Terrada et al.
(Continued)

FOREIGN PATENT DOCUMENTS

JP      10-221372 A     8/1998
JP      2002-174643 A   6/2002
(Continued)

OTHER PUBLICATIONS

Office Action dated Mar. 15, 2022 from the Taiwanese Patent Office in Application No. 110112930.
(Continued)

*Primary Examiner* — Dominic E Hawkins
(74) *Attorney, Agent, or Firm* — Sughrue Mion, PLLC

(57) ABSTRACT

The disclosure relates to a method of fabricating a test socket that supports a probe stretchable in a longitudinal direction. The method of fabricating a test socket includes forming a coupling block by joining an insulating member of an insulating material to one surface of a base member of a conductive material, forming a probe accommodating hole for accommodating the probe in the coupling block and a first support hole for supporting one end portion of the probe, forming a second support hole in a cover member of an insulating material for supporting the other end portion of the probe, inserting the probe into the probe accommodating hole so that the one end portion of the probe is supported by the first support hole, and joining the cover member to the other surface of the base member so that the other end portion of the probe is supported by the second support hole.

18 Claims, 18 Drawing Sheets

(56) References Cited

U.S. PATENT DOCUMENTS

| | | | |
|---|---|---|---|
| 2004/0212381 A1 | 10/2004 | Yoshida et al. | |
| 2004/0212383 A1 | 10/2004 | Yanagisawa et al. | |
| 2005/0088192 A1* | 4/2005 | Haga | G01R 1/06716 438/17 |
| 2006/0094134 A1 | 5/2006 | Yoshida | |
| 2007/0145990 A1* | 6/2007 | Fukushima | G01R 1/045 324/755.05 |
| 2008/0088331 A1* | 4/2008 | Yoshida | G01R 1/0466 324/755.05 |
| 2010/0188112 A1* | 7/2010 | Yoshida | G01R 1/045 324/755.01 |
| 2018/0188290 A1 | 7/2018 | Park et al. | |

FOREIGN PATENT DOCUMENTS

| | | |
|---|---|---|
| JP | 2004-325305 A | 11/2004 |
| JP | 2004-325306 A | 11/2004 |
| JP | 2005-351731 A | 12/2005 |
| JP | 2006-66205 A | 3/2006 |
| JP | 2006-125988 A | 5/2006 |
| JP | 2007-178163 A | 7/2007 |
| JP | 2007-178165 A | 7/2007 |
| JP | 2008-70146 A | 3/2008 |
| JP | 2009-156710 A | 7/2009 |
| JP | 4431780 B2 | 3/2010 |
| JP | 2010-175371 A | 8/2010 |
| JP | 2018-529932 A | 10/2018 |
| KR | 10-2009-0090854 A | 8/2009 |
| KR | 10-0985500 B1 | 10/2010 |
| KR | 10-2011-0015474 A | 2/2011 |
| KR | 10-1047430 B1 | 7/2011 |
| KR | 10-2044753 B1 | 11/2019 |
| TW | 200307814 A | 12/2003 |
| TW | I463141 B | 12/2014 |
| WO | 2009/102029 A1 | 8/2009 |
| WO | 2019/225967 A1 | 11/2019 |

OTHER PUBLICATIONS

Notification of Reasons for Refusal dated Feb. 28, 2023 from the Japanese Property Office in application No. 2022-519444.

Office Action of Korean Application No. KR 10-2020-0061448 dated Apr. 9, 2021.

Notice of Allowance of Korean Application No. 10-2020-0061448 dated Jul. 27, 2021.

International Search Report of PCT/KR2021/006236 dated Sep. 6, 2021 [PCT/ISA/210].

Written Opinion of PCT/KR2021/006236 dated Sep. 6, 2021 [PCT/ISA/237].

Office Action dated Aug. 1, 2023 issued in corresponding Japanese Patent Application No. 2022-519444.

* cited by examiner

[Figure 1]
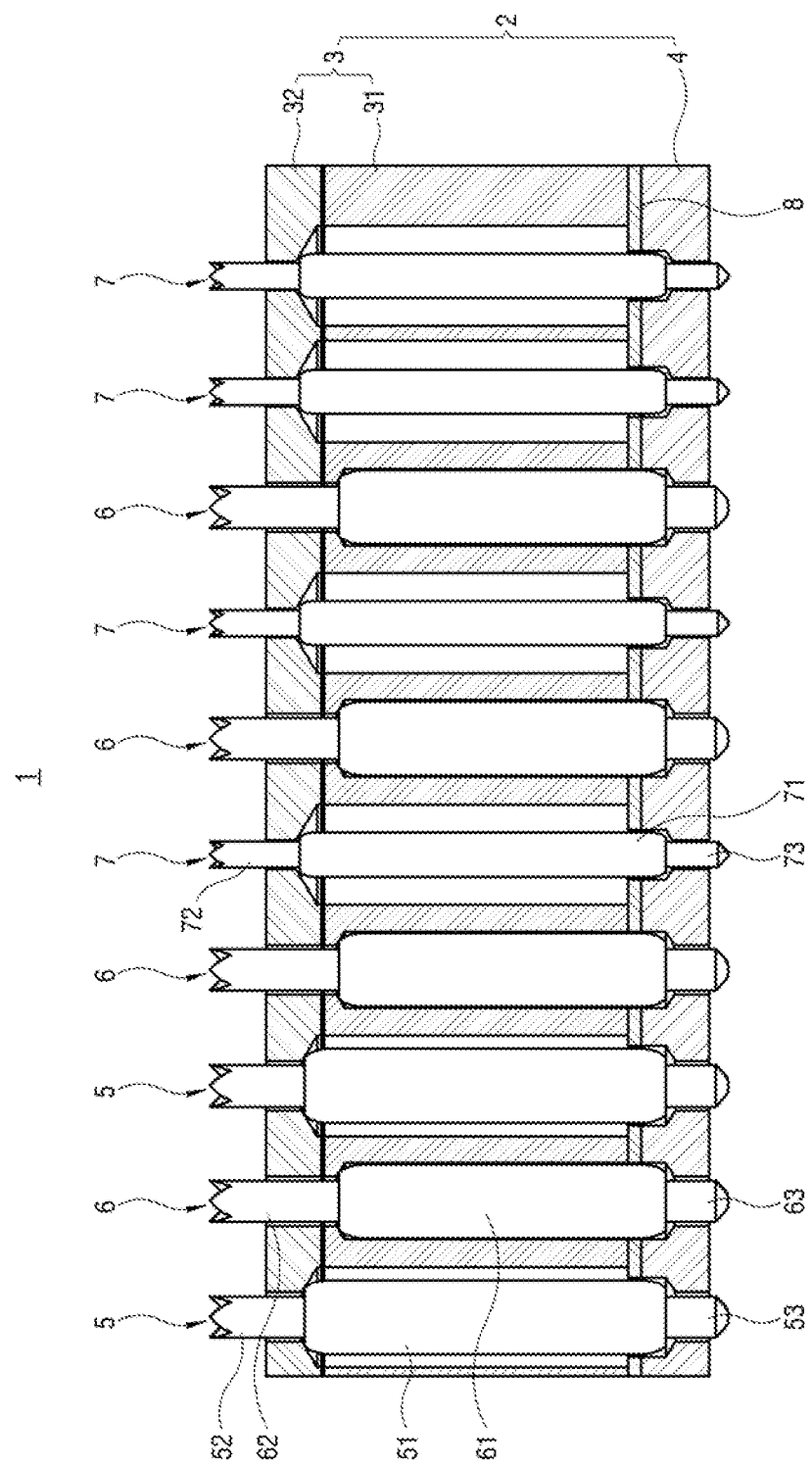

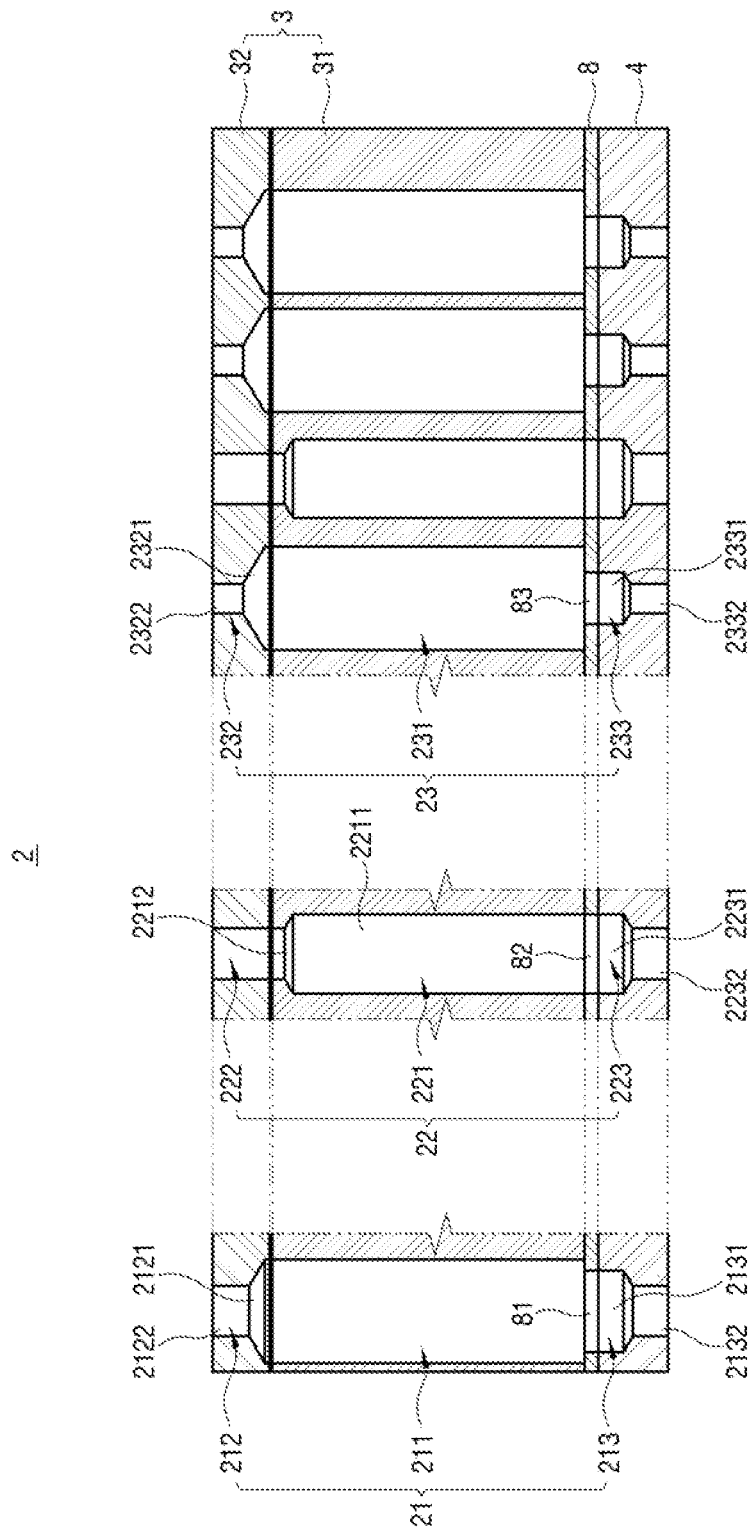
[Figure 2]

[Figure 3]
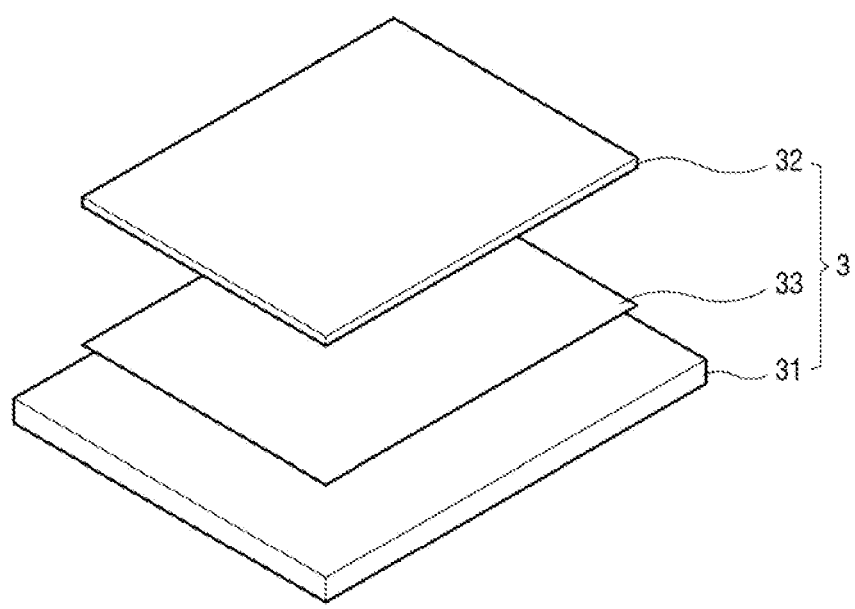

【Figure 4】
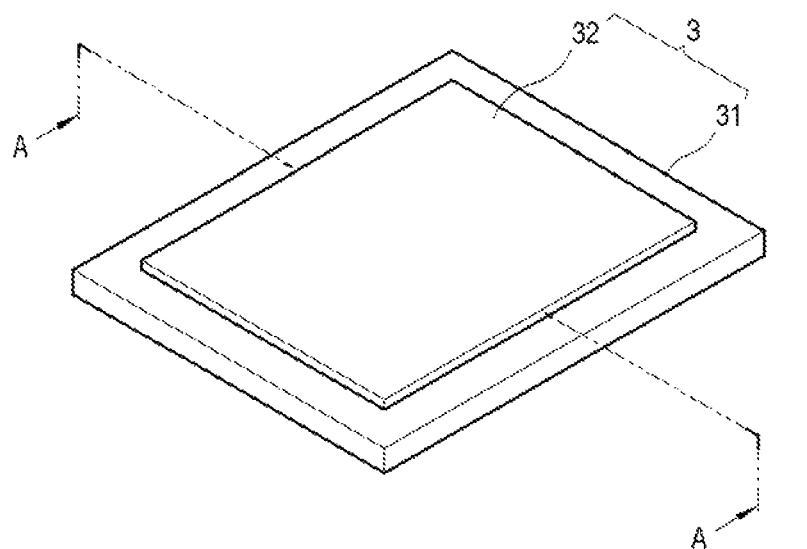
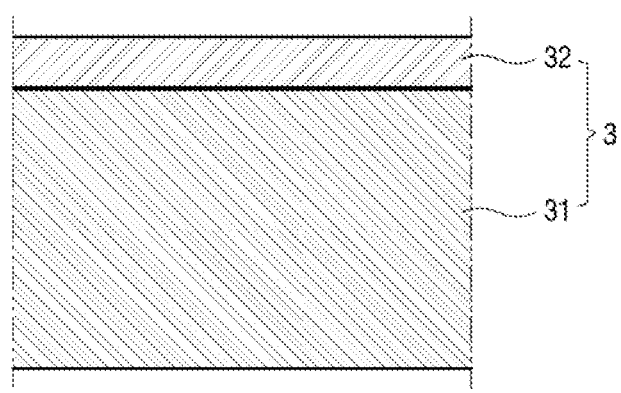

【Figure 5】
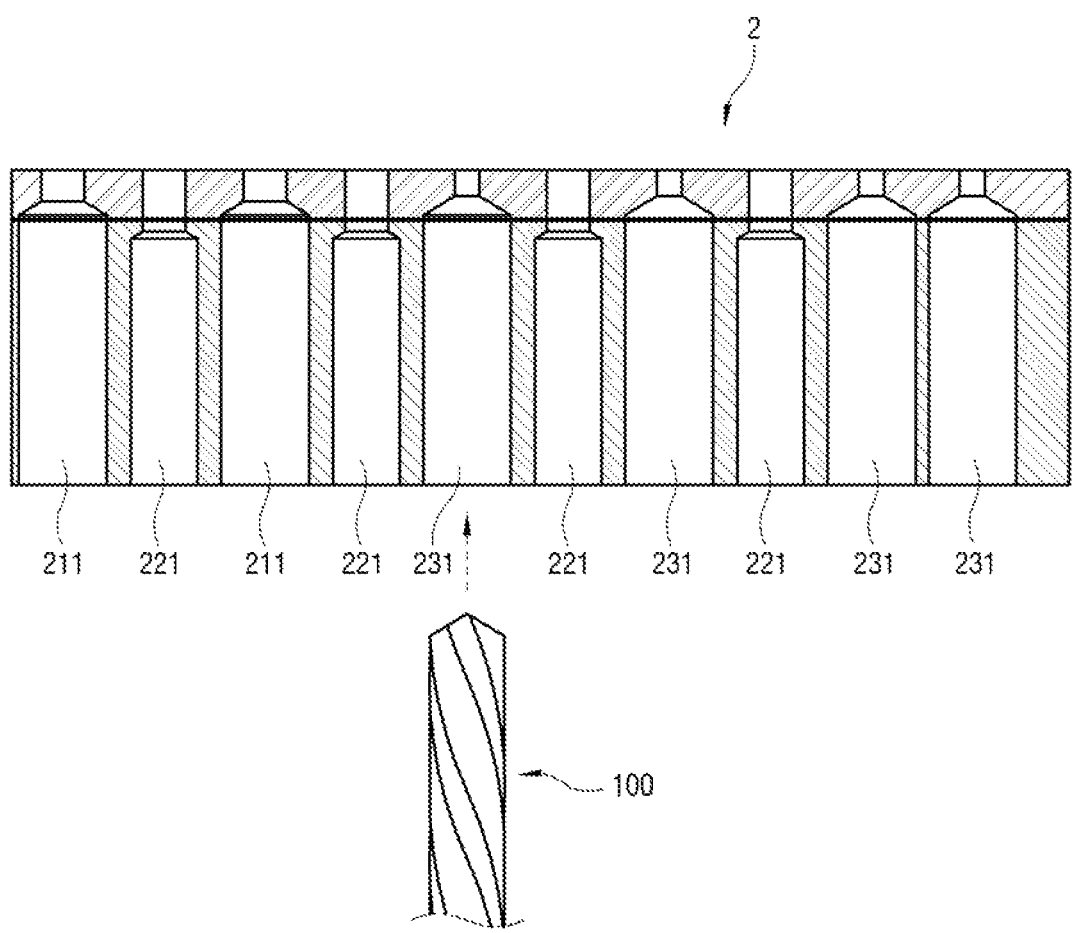

[Figure 6]
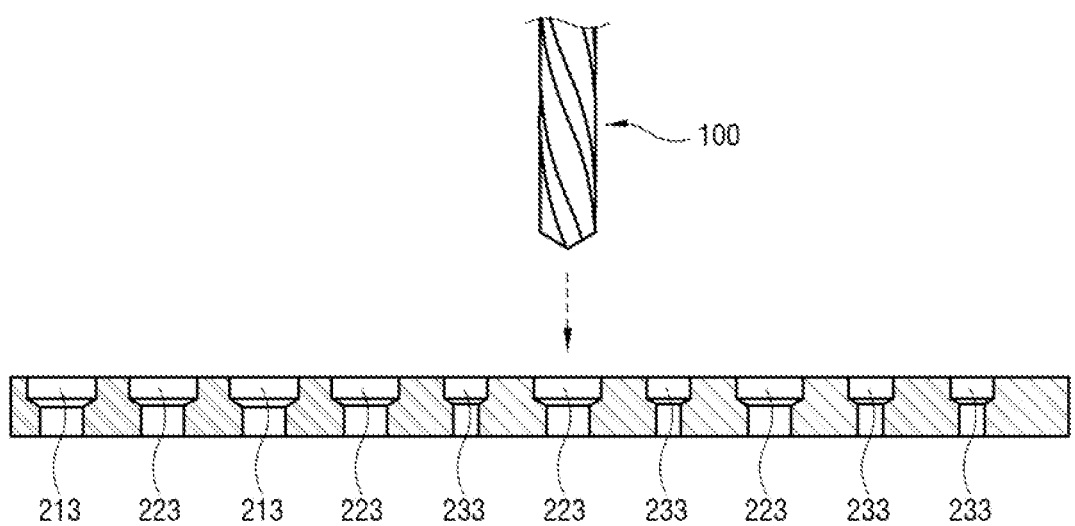

[Figure 7]
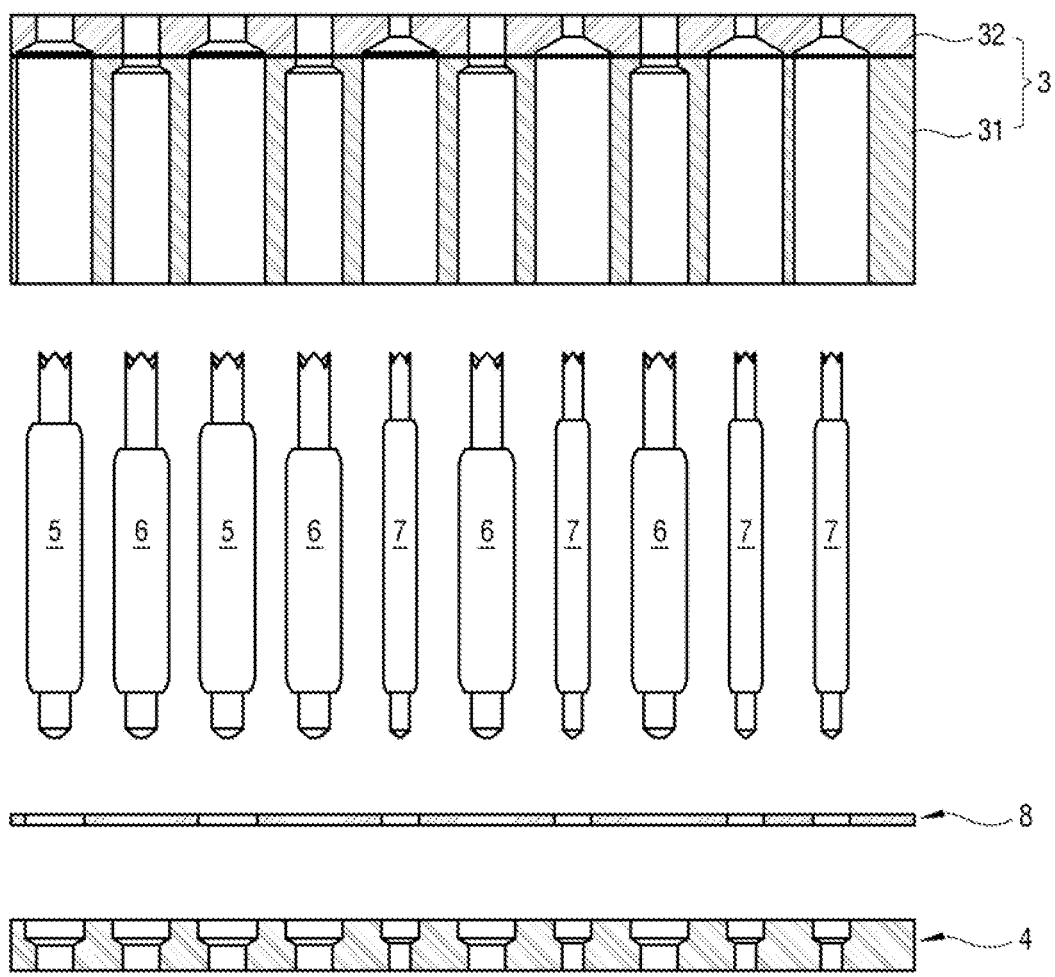

【Figure 8】
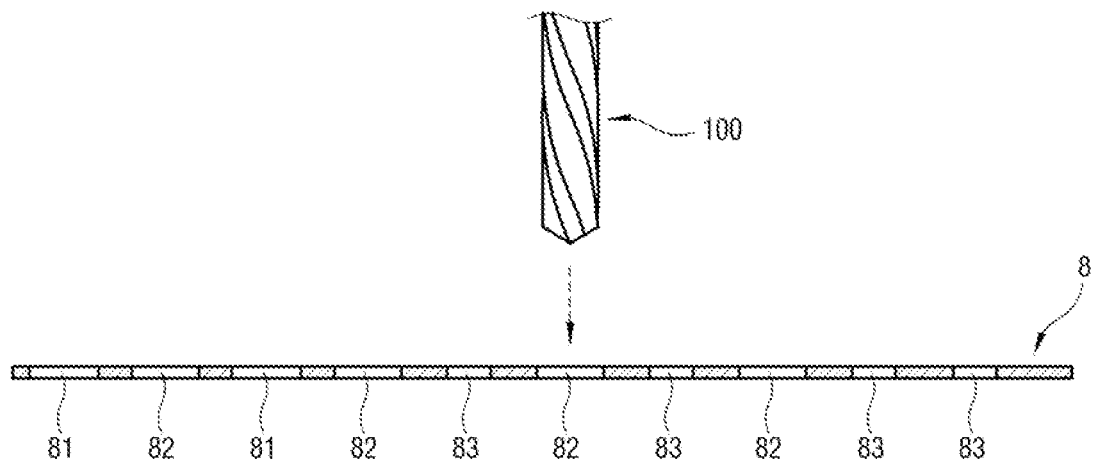
【Figure 9】
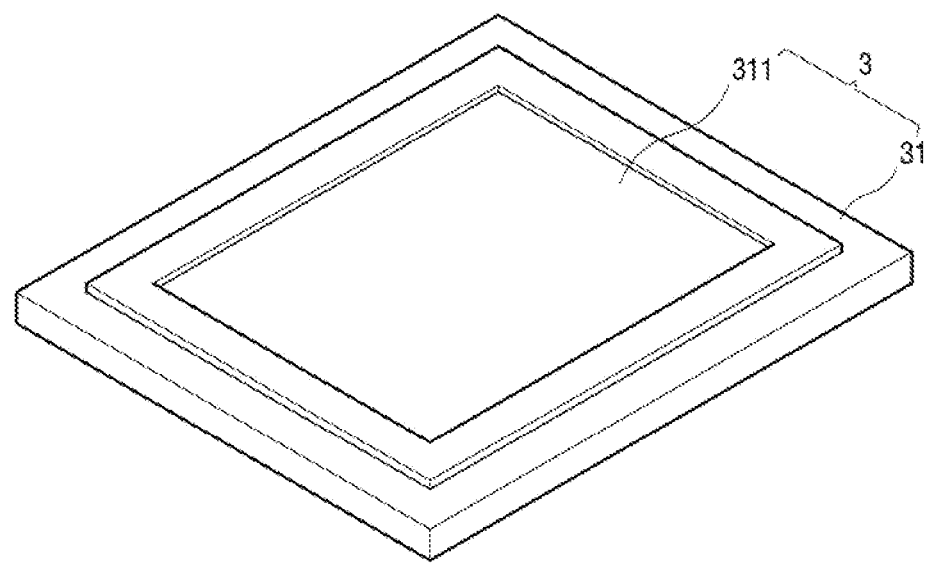

【Figure 10】
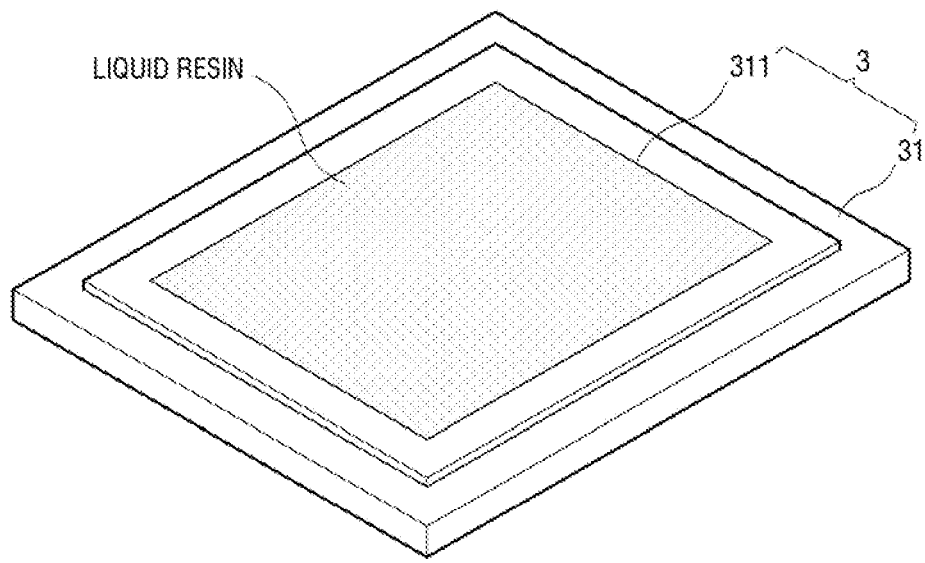
【Figure 11】
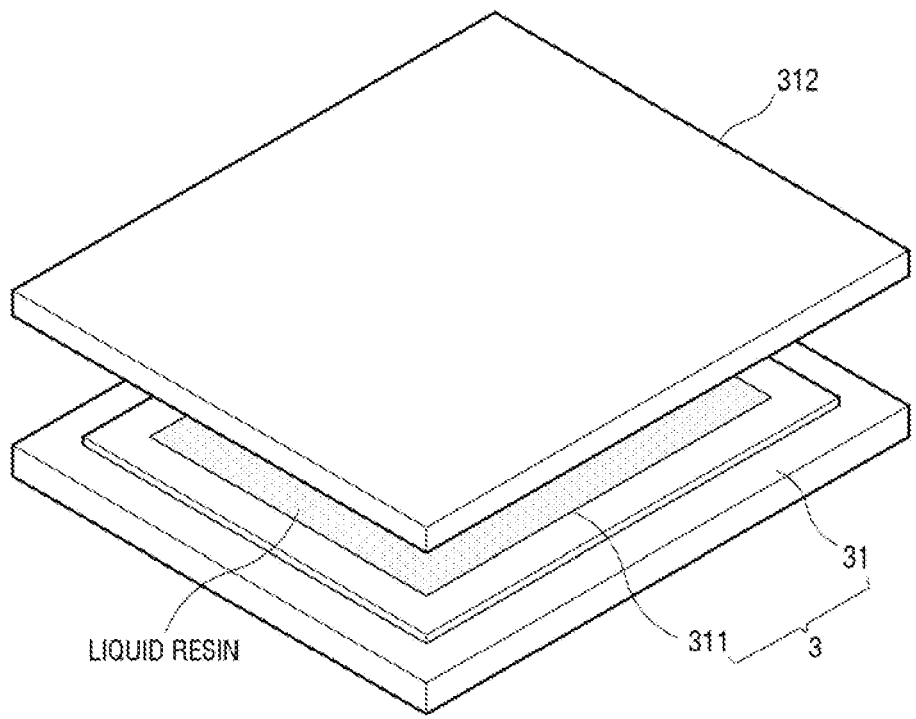

【Figure 12】
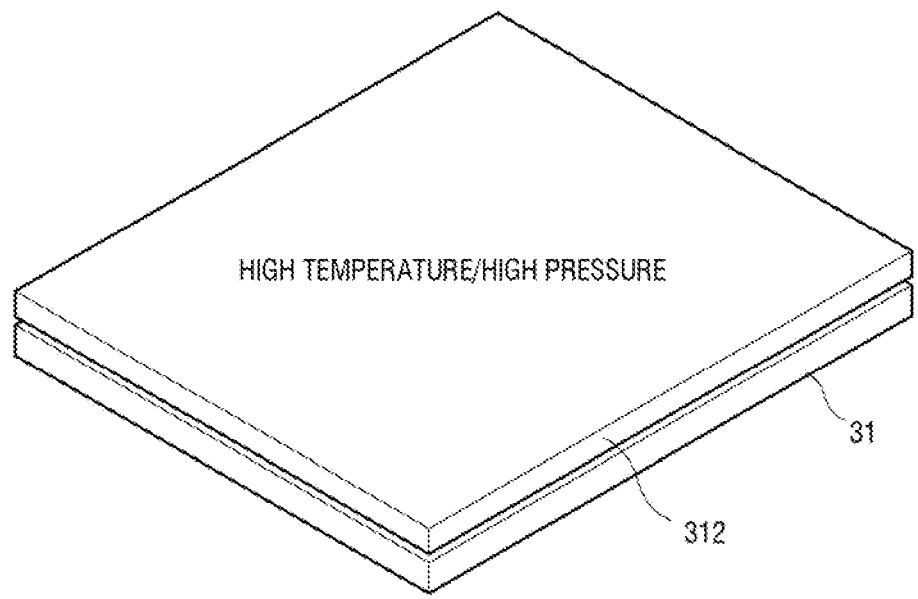
【Figure 13】
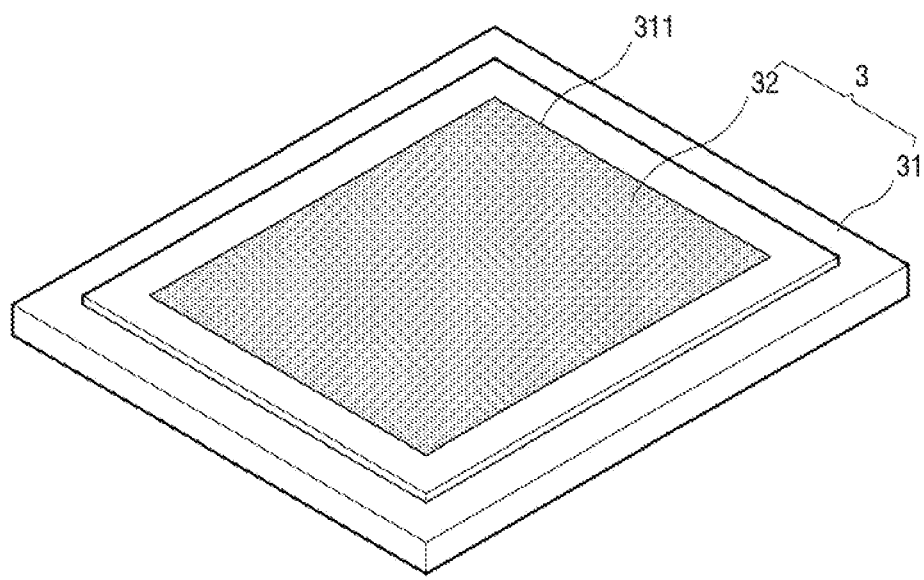

【Figure 14】
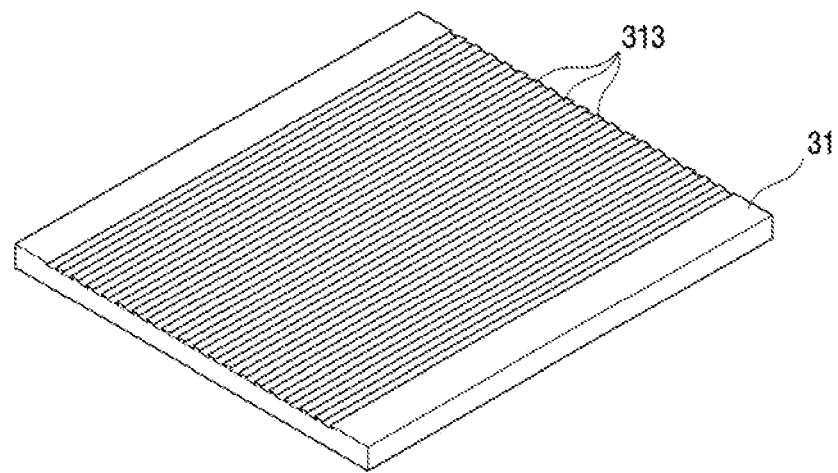
【Figure 15】
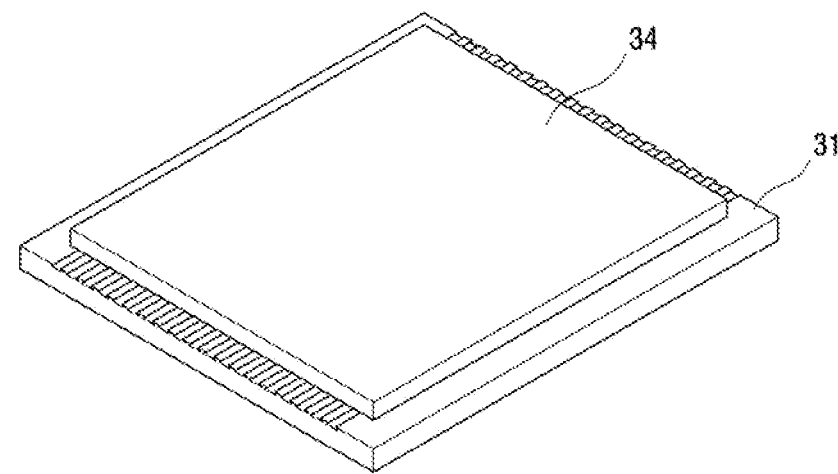

[Figure 16]
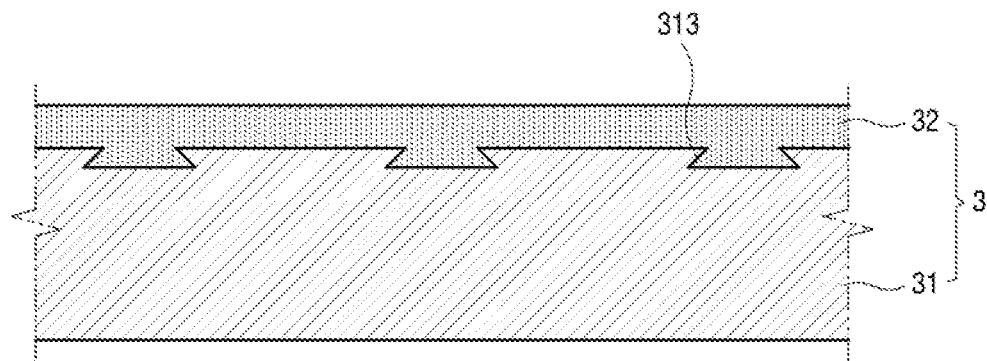
[Figure 17]
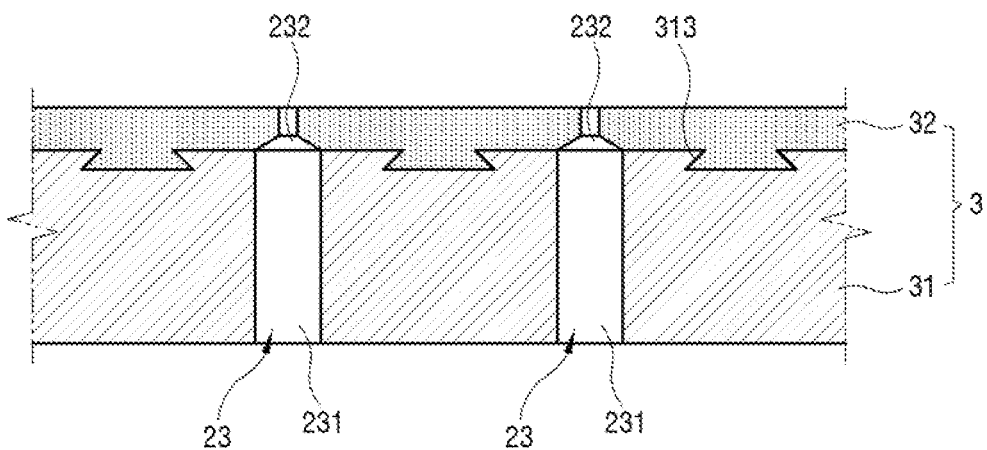

【Figure 18】
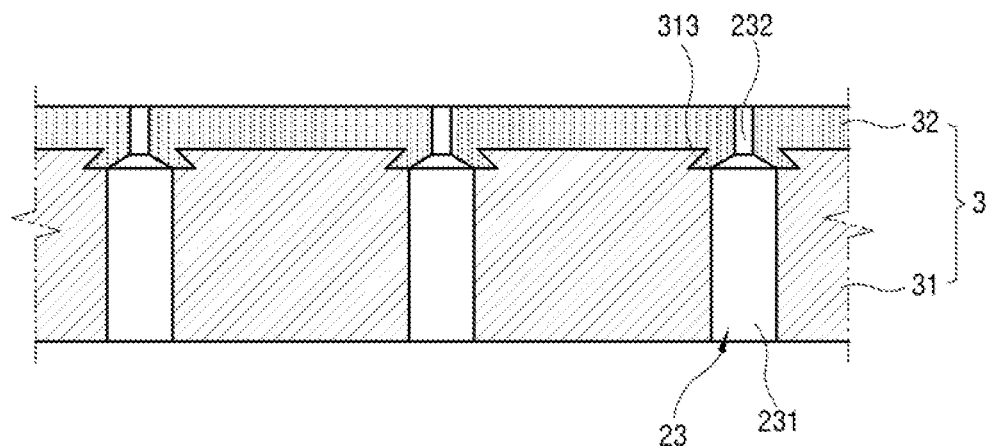
【Figure 19】
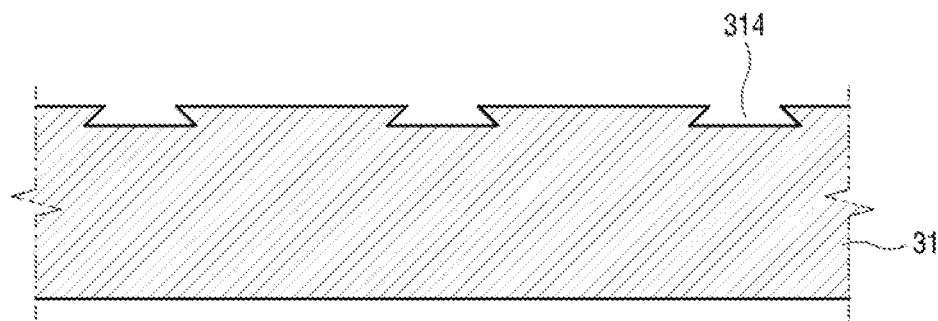
【Figure 20】
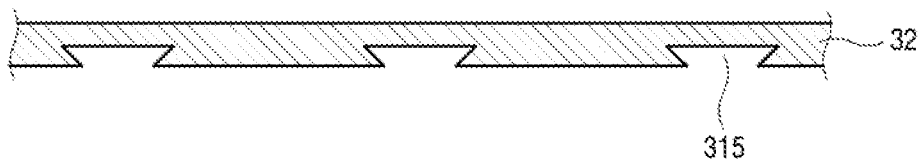

【Figure 21】
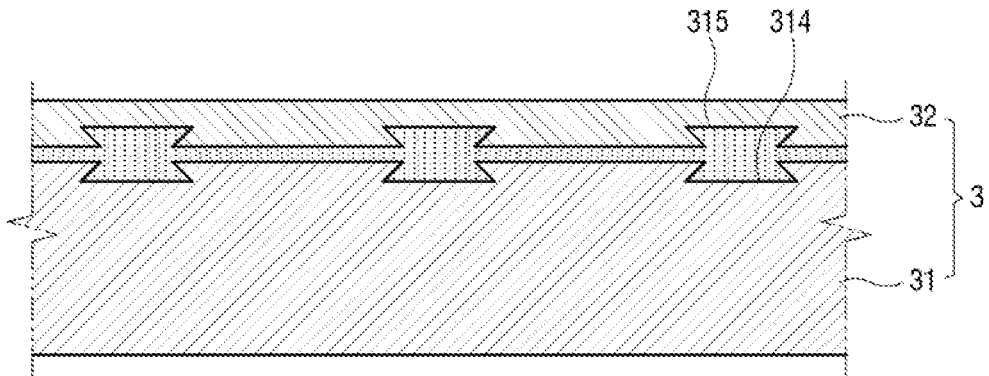
【Figure 22】
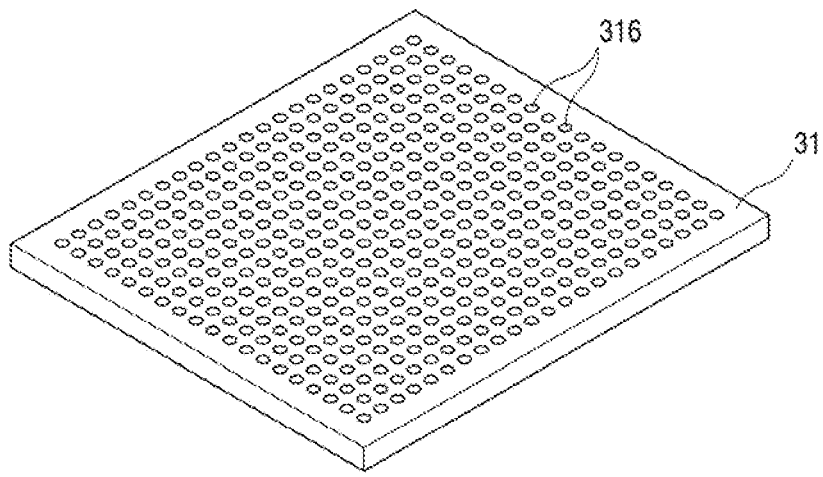
【Figure 23】
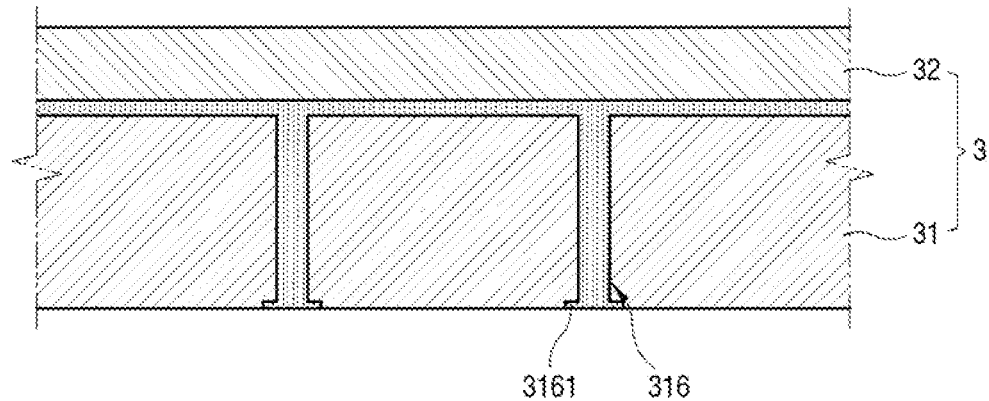

【Figure 24】
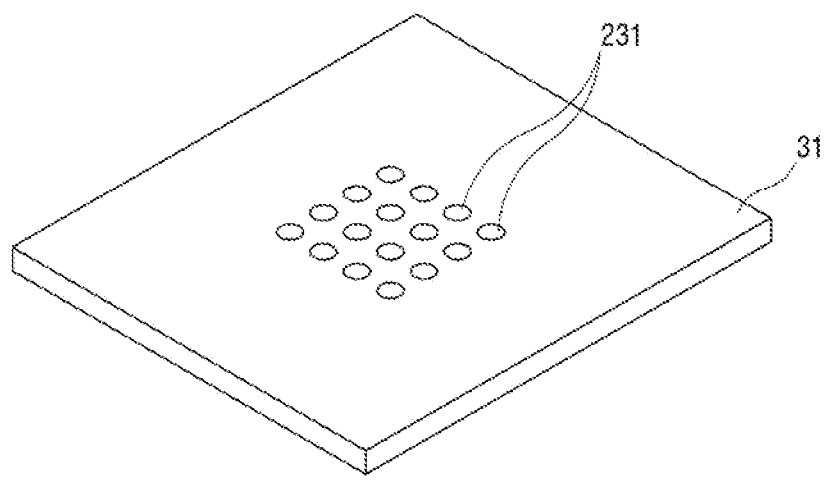
【Figure 25】
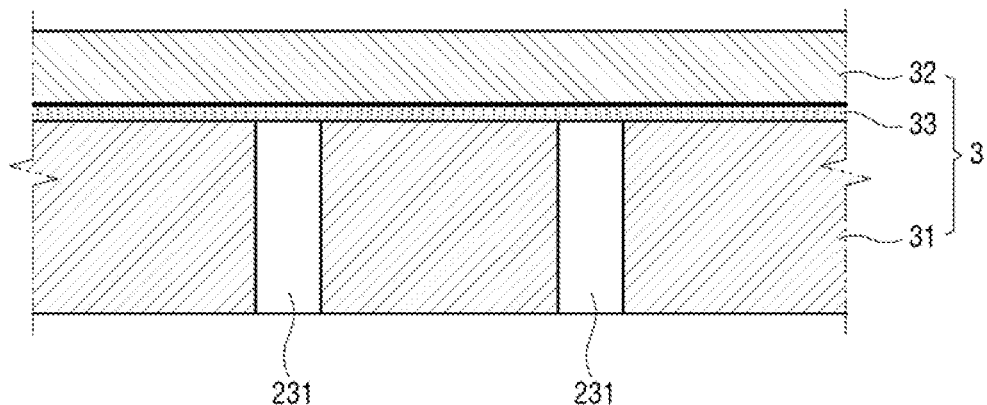

【Figure 26】
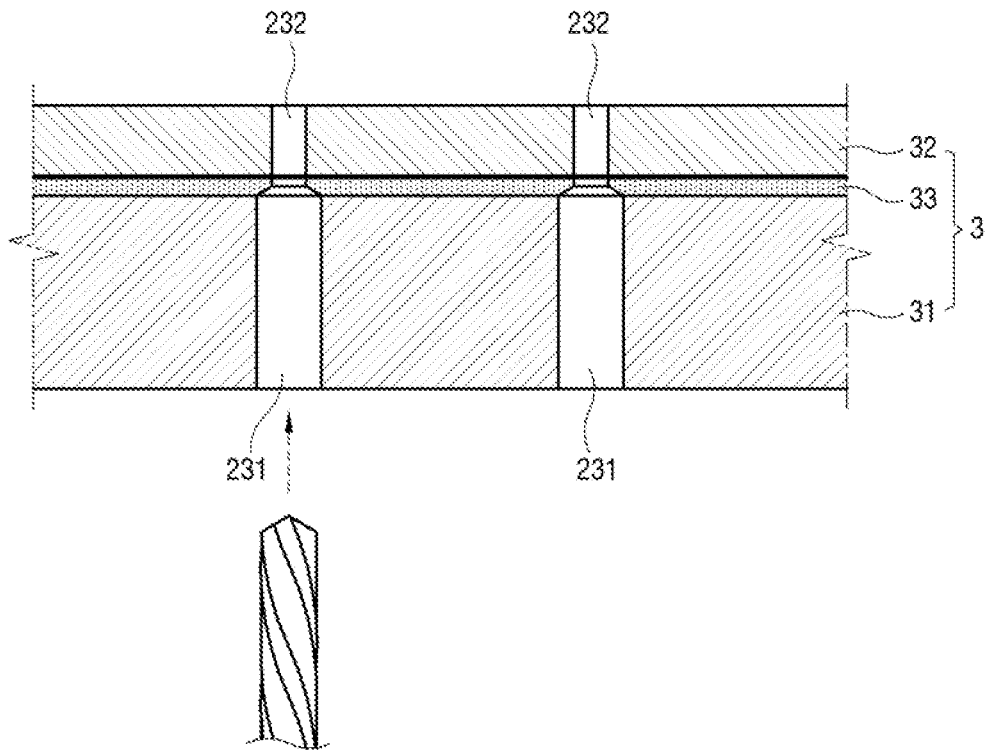
【Figure 27】
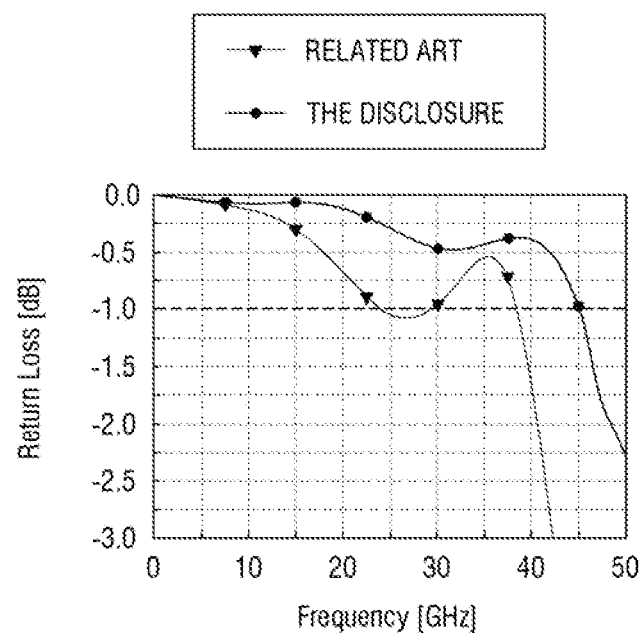

【Figure 28】
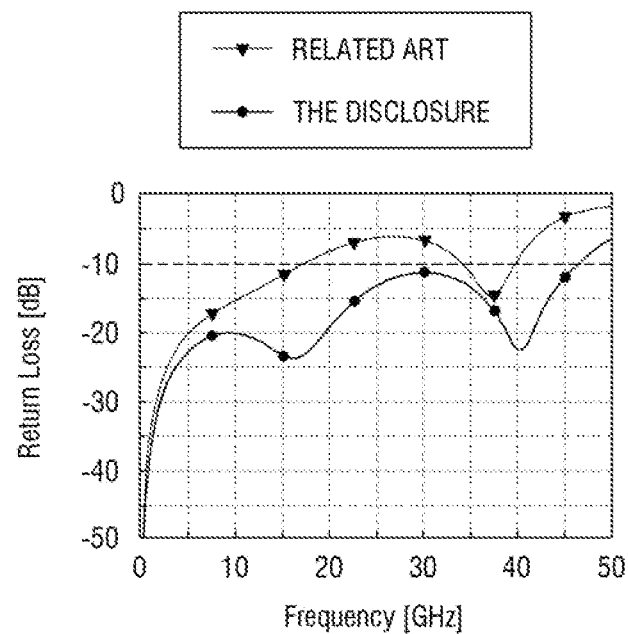
【Figure 29】
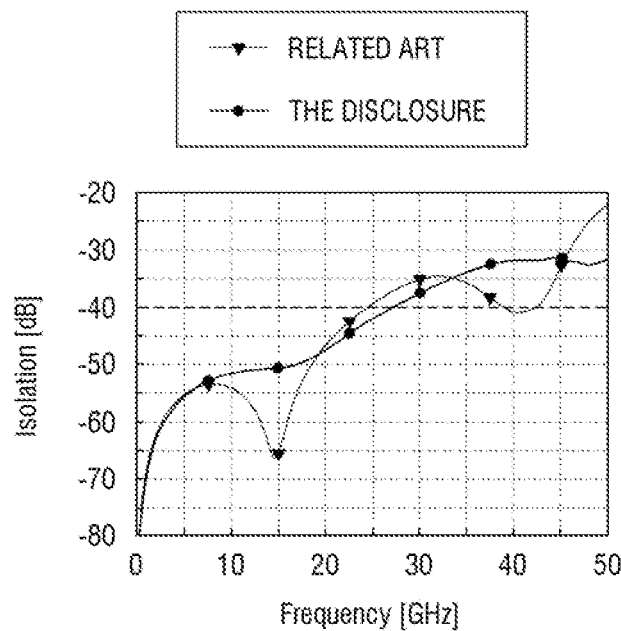

【Figure 30】
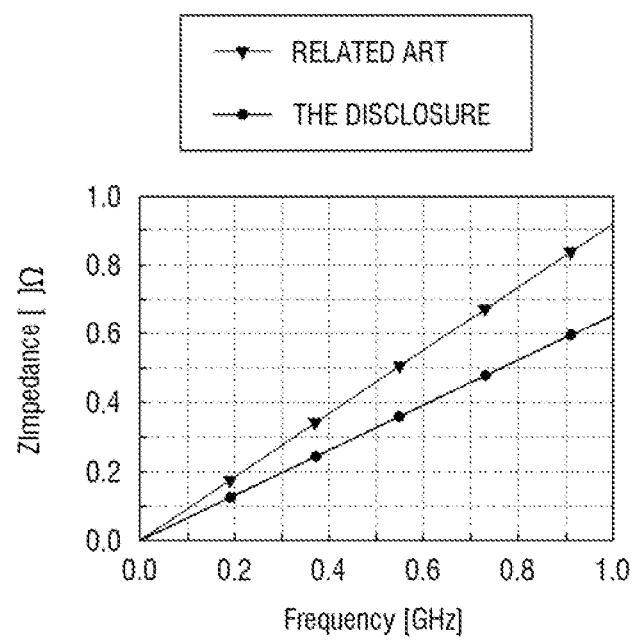

METHOD FOR FABRICATING TEST SOCKET

CROSS REFERENCE TO RELATED APPLICATIONS

This application is a National Stage of International Application No. PCT/KR2021/006236 filed on May 18, 2021, claiming priority based on Korean Patent Application No. 10-2020-0061448 filed on May 22, 2020.

TECHNICAL FIELD

The disclosure relates to a method of fabricating a test socket for testing electrical characteristics of a test object.

BACKGROUND ART

A test socket for high-frequency or high-speed semiconductor testing shields interference or noise between adjacent signal probes by supporting signal probes to a conductive block in a non-contact state. In a method of supporting the signal probe on the conductive block in the non-contact state, insulating support plates are disposed on both sides of the conductive block to support both end portions of the signal probe. At this time, after a probe accommodating hole for accommodating a barrel of the probe is formed in the conductive block and a probe supporting hole for supporting an end portion of the barrel is formed on the insulating support plate, the conductive block and the insulating support are joined by a bolt so that the probe accommodating hole and the probe supporting hole are aligned. In the conventional method of fabricating a test socket, since the process of fabricating the probe accommodating hole and the process of fabricating the probe supporting hole are individually performed, as the number of probes increases, the process error and alignment error also increase. Therefore, the signal probes accommodated in and supported by the plurality of probe accommodating holes and the probe support holes deviate from central axes of the probe accommodating holes, and as a result, insertion loss characteristics, return loss characteristics, crosstalk characteristics, isolation characteristics, Z-Impedance characteristics, and inductance characteristics may deteriorate.

DISCLOSURE

Technical Problem

The disclosure is to provide a method of fabricating a test socket for high-frequency or high-speed semiconductor testing with excellent characteristics.

Technical Solution

In one general aspect, there is provided a method of fabricating a test socket that supports a probe stretchable in a longitudinal direction. The method of fabricating a test socket includes forming a coupling block by joining an insulating member of an insulating material to one surface of a base member of a conductive material, forming a probe accommodating hole for accommodating the probe in the coupling block and a first support hole for supporting one end portion of the probe in the coupling block, forming a second support hole in a cover member of an insulating material for supporting the other end portion of the probe, inserting the probe into the probe accommodating hole so that the one end portion of the probe is supported by the first support hole, and joining the cover member to the other surface of the base member so that the other end portion of the probe is supported by the second support hole.

The forming of the coupling block may include arranging an adhesive sheet between the base member and the insulating member and heating and pressing the adhesive sheet.

The adhesive sheet may include a curable adhesive.

The forming of the coupling block may include forming a depressed portion in an area where the insulating member is formed on one surface of the base member, filling a resin in the depressed portion, covering the depressed portion filled with the resin with a cover, curing the resin, and separating the cover.

The forming of the coupling block may include insert-injecting the insulating member onto one surface of the base member.

The method may further comprise forming at least one coupling groove on one surface of the base member.

The coupling groove may have a cross-sectional area that widens toward a bottom.

The coupling groove may be formed by being excluded from the area where the probe accommodating hole is provided.

The coupling groove may be provided to surround the probe accommodating hole.

The base member may include a coupling hole penetrating in a thickness direction.

The coupling hole is formed by being excluded from the area where the probe accommodating hole is provided.

The method may further include interposing a gap plate between the coupling block and the cover member.

In another general aspect, there is provided a method of fabricating a test socket that supports a probe stretchable in a longitudinal direction. The method of fabricating a test socket may include forming a probe accommodating hole for accommodating the probe in a base member made of a conductive material, forming a coupling block by joining an insulating member of an insulating material to one surface of the base member, forming a first support hole for supporting one end portion of the probe to the insulating member of the coupling block through the probe accommodating hole, forming a second support hole in a cover member of an insulating material for supporting the other end portion of the probe is, inserting the probe into the probe accommodating hole so that the one end portion of the probe is supported by the first support hole, and joining the cover member to the other surface of the base member so that the other end portion of the probe is supported by the second support hole.

There is provided a test socket fabricated according to the embodiment of the disclosure.

Advantageous Effects

In the method of manufacturing an test socket according to an embodiment of the present invention, after the base member and the insulating member are integrally bonded to forma coupling block, the probe accommodating hole and the probe supporting hole for accommodating the signal probes are formed in a single process. As a result, alignment or process error can be reduced so that the signal probe can be accurately positioned along the central axis of the probe accommodating hole, and hereby insertion loss, return loss, crosstalk or isolation, Z-impedance and inductance characteristics can be improved.

DESCRIPTION OF DRAWINGS

FIG. 1 is a cross-sectional view illustrating a test socket according to a first embodiment of the disclosure.

FIG. 2 is a cross-sectional view illustrating a socket block of FIG. 1.

FIGS. 3 to 7 are diagrams illustrating a method of fabricating a test socket of FIG. 1.

FIG. 8 is a cross-sectional view illustrating a gap plate of FIG. 2.

FIGS. 9 to 13 are diagrams illustrating a method of fabricating a coupling block according to a second embodiment of the disclosure.

FIGS. 14 to 16 are diagrams illustrating a method of fabricating a coupling block according to a third embodiment of the disclosure.

FIGS. 17 and 18 are diagrams illustrating a state in which a signal probe hole is formed in a coupling block 3 illustrated in FIG. 16.

FIGS. 19 to 21 are diagrams illustrating a process of forming a joined coupling block according to a fourth embodiment of the disclosure.

FIGS. 22 and 23 are diagrams illustrating a process of forming a joined coupling block according to a fifth embodiment of the disclosure.

FIGS. 24 to 26 are diagrams illustrating a method of fabricating a test socket according to a sixth embodiment of the disclosure.

FIGS. 27 to 30 are graphs illustrating a comparison between insertion loss, return loss, isolation and Z-impedance characteristics of the related art and the disclosure.

BEST MODE

Hereinafter, exemplary embodiments according to the disclosure will be described in detail with reference to the drawings.

FIG. 1 is a cross-sectional view illustrating a test socket 1 according to a first embodiment of the disclosure.

Referring to FIG. 1, the test socket 1 includes a socket block 2 and a plurality of probes, for example, as a power probe 5, a ground probe 6, a signal probe, or an RF probe 7 (hereinafter, referred to as 'signal probe'). The test socket 1 includes only any one or two of the power probe 5, the ground probe 6, and the signal probe 7.

The socket block 2 includes a coupling block 3 and a cover member 4.

The coupling block 3 may be formed by integrally joining an insulating member 32 to one surface of the base member 31.

The base member 31 may be made of a conductive material, for example, brass or the like. The base member 31 may be formed by coating an insulating material with a conductive material.

The insulating member 32 may be made of an insulating material, for example, engineering plastic, ceramic, or the like.

The cover member 4 may be joined to a back surface of the base member 31. The cover member 4 may be made of an insulating material, for example, engineering plastic, ceramic, or the like.

The power probe 5 may be accommodated in the base member 31 in a non-contact state, one end portion thereof may be supported by the insulating member 32 and the other end portion thereof may be supported by the cover member 4. The power probe 5 includes a barrel 51, a first plunger 52, a second plunger 53, and a spring (not illustrated). The first plunger 52 and the second plunger 53 can be stretched along the longitudinal direction with a spring interposed therebetween, and may partially protrude from upper and lower surfaces of the socket block 2 to electrically connect between a power contact of a test object and a power contact of an inspection circuit.

The ground probe 6 may be supported in contact with the base member 31, and the ground probe 6 may be supported so that one end portion thereof may pass through the insulating member 32 and the other end portion thereof may pass through the cover member 4. The ground probe 6 includes a barrel 61, a first plunger 62, a second plunger 63, and a spring (not illustrated). The first plunger 62 and the second plunger 63 can be stretched along the longitudinal direction with a spring interposed therebetween, and may partially protrude from upper and lower surfaces of the socket block 2 to electrically connect between a ground contact of the test object and a ground contact of the inspection circuit.

The signal probe 7 may be accommodated in the base member 31 in a non-contact state, one end portion thereof may be supported by the insulating member 32 and the other end portion thereof may be supported by the cover member 4. The signal probe 7 includes a barrel 71, a first plunger 72, a second plunger 73, and a spring (not illustrated). The first plunger 72 and the second plunger 73 can be stretched along the longitudinal direction with a spring interposed therebetween, and may partially protrude from upper and lower surfaces of the socket block 2 to electrically connect between a signal contact of the test object and a signal contact of the inspection circuit.

A gap plate 8 for aligning the positions of the plurality of probes 5, 6, and 7 is provided between the coupling block 3 and the cover member 4.

The gap plate 8 may be made of an insulating material, for example, engineering plastic or ceramic. The gap plate 8 may correct alignment errors when the coupling block 3 and the cover member 4 are joined.

The power probe 5, the ground probe 6, and the signal probe 7 are not limited to a pogo type described above, but any probe that can be stretched may be applied.

FIG. 2 is a cross-sectional view illustrating a socket block 2 of FIG. 1.

Referring to FIG. 2, the socket block 2 includes a power probe hole 21 for accommodating the power probe 5 in a non-contact state, a ground probe hole 22 for accommodating the ground probe 6 in a contact state, and a signal probe hole 23 for accommodating the signal probe 7 in a non-contact state.

The power probe hole 21 may include a power probe accommodating hole 211 formed in the base member 31 to accommodate the power probe 5 in a non-contact state, a first power probe support hole 212 formed in the insulating member 32 to support one end portion of the power probe 5, and a second power probe support hole 213 formed in the cover member 4 to support the other end portion of the power probe 5.

The power probe accommodating hole 211 may be formed to vertically penetrate the base member 31 constantly with a diameter larger than an outer diameter of the barrel 51 of the power probe 5.

The first power probe support hole 212 includes a first barrel support groove 2121 formed in the insulating member 32 in a shape corresponding to one end portion of the barrel 51 of the power probe 5, and a first plunger through hole 2122 communicating with the first barrel support groove 2121 and formed in the insulating member 32 so that the first plunger 52 passes therethrough.

The second power probe support hole 213 includes a second barrel support groove 2131 formed in the cover member 4 in a shape corresponding to the other end portion of the barrel 51 of the power probe 5, and a second plunger through hole 2132 communicating with the second barrel support groove 2131 and formed in the cover member 4 so that the second plunger 53 passes therethrough.

The ground probe hole 22 includes a ground probe accommodating hole 221 formed in the base member 31 to accommodate the ground probe 6 in a contact state, a ground probe through hole 222 formed in the insulating member 32 so that one end portion of the ground probe 6 passes therethrough, and a ground probe support hole 223 formed in the cover member 4 to support the other end portion of the ground probe 6.

The ground probe accommodating hole 221 includes a barrel accommodating hole 2211 formed in the base member 31 to constantly extend to the same diameter as the outer diameter of the barrel 61 of the ground probe 6, a barrel end portion accommodating groove 2212 formed in the base member 31 to accommodate the one end portion of the barrel 61 of the ground probe 6, and a plunger accommodating hole 2213 formed in the base member 31 to accommodate the first plunger 62 of the ground probe 6. The barrel end portion accommodating groove 2212 and the plunger accommodating hole 2213 may be formed in the insulating member 32.

The ground probe through hole 222 may be formed in the insulating member 32 so that the first plunger 62 of the ground probe 6 passes therethrough.

The ground probe support hole 223 includes a barrel support groove 2231 formed in the cover member 4 in a shape corresponding to the other end portion of the barrel 61 of the ground probe 6 and a plunger through hole 2232 communicating with the barrel support groove 2231 and formed in the cover member 4 so that the second plunger 63 passes therethrough.

The signal probe hole 23 includes a signal probe accommodating hole 231 formed in the base member 31 to accommodate the signal probe 7 in a non-contact state, a first signal probe support hole 232 formed in the insulating member 32 to support one end portion of the signal probe 7, and a second signal probe support hole 233 formed in the cover member 4 to support the other end portion of the signal probe 7.

The signal probe accommodating hole 231 may be formed to vertically penetrate the base member 31 constantly with a diameter larger than an outer diameter of the barrel 71 of the signal probe 7.

The first signal probe support hole 232 includes a first barrel support groove 2321 formed in the insulating member 32 in a shape corresponding to one end portion of the barrel 71 of the signal probe 7, and a first plunger through hole 2322 communicating with the first barrel support groove 2321 and formed in the insulating member 32 so that the first plunger 72 passes therethrough.

The second signal probe support hole 233 includes a second barrel support groove 2331 formed in the cover member 4 in a shape corresponding to the other end portion of the barrel 71 of the signal probe 7, and a second plunger through hole 2332 communicating with the second barrel support groove 2331 and formed in the cover member 4 so that the second plunger 73 passes therethrough.

The gap plate 8 includes a power hole 81, a ground hole 82, and a signal hole 83 corresponding to the outer diameters of the barrels 51, 61, and 71 of the power probe 5, the ground probe 6, and the signal probe 7.

FIGS. 3 to 7 are diagrams illustrating the method of fabricating a test socket 1 of FIG. 1.

As illustrated in FIG. 3, the insulating member 32 may adhere to the upper surface of the base member 31 by using an adhesive sheet 33. Here, the adhesive sheet 33 may include, for example, a thermosetting epoxy resin adhesive.

As illustrated in FIG. 4, the base member 31 and the insulating member 32 are joined by being applied with a pressure of 1 kf/cm2 for about 80 minutes in an atmosphere of, for example, 170° C., thereby forming the coupling block 3.

As illustrated in FIG. 5, the power probe hole 21, the ground probe hole 22, and the signal probe hole 23 may be formed in the coupling block 3 by using, for example, a drill 100.

As illustrated in FIG. 6, the second power probe support hole 213 for supporting the other end of the power probe 5, the ground probe support hole 223 for supporting the other end of the ground probe 6, and the second signal probe support hole 233 for supporting the other end of the signal probe 7 may be formed in the cover member 4 by using, for example, the drill 100.

As illustrated in FIG. 7, after the power probe 5, the ground probe 6, and the signal probe 7 are inserted into the power probe hole 21, the ground probe hole 22, and the signal probe hole 23, respectively, the coupling block 3 and the cover member 4 may be joined by, for example, a bolt or a screw (not illustrated).

As described above, since the signal probe accommodating hole 231 and the first signal probe support hole 232 constituting the signal probe hole 23 in the coupling block 3 are drilled in a single process, there is no error due to alignment even when a large number of signal probe holes 23 are formed in the test socket 1. Therefore, the signal probe 7 may be supported to fit a central axis of the signal probe hole 23, and as a result, insertion loss, return loss, crosstalk or isolation, Z-impedance, and inductance characteristics may be improved.

FIG. 8 is a cross-sectional view illustrating the gap plate 8 of FIG. 2.

As illustrated in FIG. 8, the gap plate 8 made of the insulating material may be formed with the power hole 81, the ground hole 82, and the signal hole 83 corresponding to each outer diameter of the barrel 51 of the power probe 5, the barrel 61 of the ground probe 6, and the barrel 71 of the signal probe 7 by, for example, the drill 100. The gap plate 8 thus formed may be interposed between the coupling block 3 and the cover member 4 as illustrated in FIG. 2.

FIGS. 9 to 13 are diagrams illustrating a method of fabricating a coupling block 3 according to a second embodiment of the disclosure.

As illustrated in FIG. 9, for example, a depressed portion 311 is formed in the area in which the insulating member 32 is to be formed on the upper surface of the base member 31 made of brass.

As illustrated in FIG. 10, for example, the depressed portion 311 of the base member 31 is filled with, for example, an epoxy resin.

As illustrated in FIG. 11, a cover 312 is covered over the depressed portion 311 of the base member 31 filled with an epoxy resin, for example.

As illustrated in FIG. 12, the epoxy resin filled in the depressed portion 311 of the base member 31 is cured by being applied with a pressure of 1 kf/cm2 for about 80 minutes in an atmosphere of, for example, 170° C.

As illustrated in FIG. 13, the cover 312 is removed to complete the coupling block 3.

As a modified embodiment, the insulating member 32 may be formed by an insert injection mold using an injection mold material of an insulating material to the depressed portion 311.

FIGS. 14 to 16 are diagrams illustrating a method of fabricating a coupling block 3 according to a third embodiment of the disclosure.

As illustrated in FIG. 14, a plurality of coupling grooves 313 extending in the thickness direction are formed on the upper surface of the base member 31, that is, the surface to which the insulating member 32 is to be coupled. In this case, the coupling groove 313 has a shape in which a cross-sectional area widens toward a bottom, for example, and may extend parallel to the base member 31 at intervals.

As illustrated in FIG. 15, after positioning the mold cover 34 so as to cover the coupling groove 313 formed on the upper surface of the base member 31, the injection molding is performed by putting an injection mold material between the base member 31 and the mold cover 34 and in the coupling groove 313. The injection molding may be performed, for example, at a pressure of 160 kf/cm2 and at 430° C. for 3.5 seconds.

As illustrated in FIG. 16, the coupling block 3 to which the insulating member 32 is firmly joined may be formed on the upper surface of the base member 31.

FIGS. 17 and 18 are diagrams illustrating a state in which the signal probe hole 23 is formed in the coupling block 3 illustrated in FIG. 16.

As illustrated in FIG. 17, the signal probe hole 23 may be formed by excluding the area in which the coupling groove 313 is formed in the coupling block 3.

As illustrated in FIG. 18, the signal probe hole 23 may be formed in the area in which the coupling groove 313 is formed in the coupling block 3.

By considering the fact that the position where the signal probe hole 23 is formed in the test socket 1 differs depending on the position of the signal contact of the test object to be tested, it may be determined whether the signal probe hole 23 is formed by excluding the coupling groove 313 region or in the region where the coupling groove 313 is formed.

FIGS. 19 to 21 are diagrams illustrating a process of forming a joined coupling block 3 according to a fourth embodiment of the disclosure.

As illustrated in FIG. 19, a plurality of first coupling grooves 314 extending in the thickness direction is formed on the upper surface of the base member 31, that is, the surface to which the insulating member 32 is joined. In this case, the first coupling groove 314 may extend in parallel with the base member 31 at an intervals.

As illustrated in FIG. 20, a second coupling groove 315 extending in the thickness direction is formed on the lower surface of the insulating member 32.

As illustrated in FIG. 21, the lower surface of the insulating member 32 is disposed on the upper surface of the base member 31 so that the first coupling groove 314 and the second coupling groove 315 face each other. Thereafter, the injection molding is performed by putting the injection mold material between the base member 31 and the insulating member 32 and in the first coupling groove 314 and the second coupling groove 315, so the firmly joined coupling block 3 may be formed.

FIGS. 22 and 23 are diagrams illustrating a process of forming a joined coupling block 3 according to a fifth embodiment of the disclosure.

As illustrated in FIG. 22, a plurality of coupling holes 316 extending to penetrate from the upper surface to the lower surface of the base member 31 are formed. As illustrated in FIG. 23, after positioning the insulating member 32 so as to cover the coupling hole 316 formed on the upper surface of the base member 31, the injection molding may be performed by putting an injection mold material between the base member 31 and the insulating member 32 and in the coupling groove 316, so the firmly joined coupling block 3 may be formed. The injection molding may be performed, for example, at a pressure of 160 kf/cm2 and at 430° C. for 3.5 seconds. The coupling hole 316 may include an extension part 3161 extending radially at the bottom.

FIGS. 24 to 26 are diagrams illustrating a method of fabricating a test socket 1 according to a sixth embodiment of the disclosure.

As illustrated in FIG. 24, the signal probe accommodating hole 231 may be formed in the base member 31 by using, for example, the drill 100.

As illustrated in FIG. 25, the insulating member 32 may adhere to the upper surface of the base member 31 by using the adhesive sheet 33. Here, the adhesive sheet 33 may include, for example, a thermosetting epoxy resin adhesive. Thereafter, the base member 31 and the insulating member 32 are joined by being applied with a pressure of 1 kf/cm2 for about 80 minutes in an atmosphere of, for example, 170° C., thereby forming the coupling block 3.

As illustrated in FIG. 26, the insulating member 32 of the coupling block 3 is formed with the first signal probe support hole 232 for supporting one end of the signal probe 7 by using, for example, the drill 100.

Thereafter, after inserting the signal probe 7 into the signal probe hole 23, the test socket 1 may be completed by joining the cover member 4 to the first coupling block 3.

FIGS. 27 to 30 are graphs showing a comparison of insertion loss characteristics, return loss characteristics, isolation characteristics, and Z-impedance characteristics of the test socket 1 according to the related art and the disclosure.

It is preferable that the insertion loss is ideally zero. Referring to FIG. 27, it can be seen that, based on the allowable insertion loss (−1.0 dB), the related art exceeds the reference at about 22.0 GHz, while the disclosure shows a very good insertion loss characteristics at about 45.2 GHz.

It is preferable that the return loss is as small as possible. Referring to FIG. 28, it can be seen that, based on the allowable return loss (−10.0 dB), the related art exceeds the reference at about 17.1 GHz, while the disclosure shows a very good return loss characteristics at about 46.5 GHz.

It is preferable that the isolation characteristics are as small as possible. Referring to FIG. 29, it can be seen that based on the allowable isolation characteristics (−40 dB), the related art exceeds the allowable isolation characteristic (−40 dB) at about 24.4 GHz, while the disclosure is about 27.0 GHz, which is somewhat superior and shows little change.

It is preferable that the Z-Impedance is as small as possible. Referring to FIG. 30, it can be seen that, based on an allowable Z-impedance (1 GHz), the related art represents about 0.9Ω, while the disclosure is about 0.65Ω, which is more excellent.

Since the method of fabricating a test socket according to the embodiment of the disclosure forms a coupling block by integrally joining the base member and the insulating member, and then the probe accommodating hole for accommodating the signal probes and the probe support hole are formed in a single process, the process error or the alignment error may be reduced, so the signal probe may be located on the central axis of the probe accommodating hole, thereby improving insertion loss, return loss, crosstalk, isolation, Z-impedance, and inductance characteristics.

In the foregoing specification, the disclosure and its advantages have been described with reference to specific embodiments. However, it will be apparent to those of ordinary skill in the art that various modifications and changes can be made without departing from the scope of the disclosure as set forth in the claims below. Accordingly, the specification and drawings should be regarded as an example of the disclosure rather than a limitation. All these possible modifications should be made within the scope of the disclosure.

The invention claimed is:

1. A method of fabricating a test socket that supports a probe stretchable in a longitudinal direction, the method comprising:
    forming a coupling block by joining an insulating member of an insulating material to one surface of a base member of a conductive material;
    forming a probe accommodating hole for accommodating the probe and a first support hole for supporting one end portion of the probe in the coupling block;
    forming a second support hole in a cover member of an insulating material for supporting the other end portion of the probe;
    inserting the probe into the probe accommodating hole so that the one end portion of the probe is supported by the first support hole; and
    joining the cover member to the other surface of the base member so that the other end portion of the probe is supported by the second support hole,
    wherein the forming the probe accommodating hole for accommodating the probe in the base member and the first support hole for supporting one end portion of the probe in the insulating member is conducted in a state in which the insulating member and the base member are combined.

2. The method of claim 1, wherein the forming of the coupling block includes:
    arranging an adhesive sheet between the base member and the insulating member; and
    heating and pressing the adhesive sheet.

3. The method of claim 2, wherein the adhesive sheet includes a curable adhesive.

4. The method of claim 1, wherein the forming of the coupling block includes:
    forming a depressed portion in an area where the insulating member is formed on one surface of the base member;
    filling a resin in the depressed portion;
    covering the depressed portion filled with the resin with a cover;
    curing the resin; and
    separating the cover.

5. The method of claim 4, wherein the curing of the resin includes:
    applying pressure of 1 kf/cm² for 80 minutes in an atmosphere of 170° C.

6. The method of claim 1, wherein the forming of the coupling block includes insert-injecting the insulating member onto one surface of the base member.

7. The method of claim 6, further comprising:
    forming at least one coupling groove on one surface of the base member.

8. The method of claim 7, wherein the coupling groove has a cross- sectional area that widens toward a bottom.

9. The method of claim 7, wherein the coupling groove is formed by being excluded from the area where the probe accommodating hole is provided.

10. The method of claim 7, wherein the coupling groove surrounds the probe accommodating hole.

11. The method of claim 6, wherein the insert-injecting the insulating member onto one surface of the base member includes:
    applying pressure to the base member at 160 kf/cm² for 3.5 seconds in an atmosphere of 430° C.

12. The method of claim 1, wherein the base member includes a coupling hole penetrating in a thickness direction.

13. The method of claim 12, wherein the coupling hole is formed by being excluded from the area where the probe accommodating hole is provided.

14. The method of claim 1, further comprising:
    interposing a gap plate between the coupling block and the cover member.

15. A test socket fabricated by the method of claim 1.

16. The method of claim 1, wherein the forming of the coupling block includes:
    applying pressure of 1 kf/cm² for 80 minutes in an atmosphere of 170° C. to the insulating member and the base member.

17. A method of fabricating a test socket that supports a probe stretchable in a longitudinal direction, the method comprising:
    forming a probe accommodating hole for accommodating the probe in a base member made of a conductive material;
    forming a coupling block by joining an insulating member of an insulating material to one surface of the base member;
    forming a first support hole for supporting one end portion of the probe to the insulating member of the coupling block through the probe accommodating hole;
    forming a second support hole in a cover member of an insulating material for supporting the other end portion of the probe;
    inserting the probe into the probe accommodating hole so that the one end portion of the probe is supported by the first support hole; and
    joining the cover member to the other surface of the base member so that the other end portion of the probe is supported by the second support hole,
    wherein the forming the probe accommodating hole for accommodating the probe in the base member and the forming the first support hole for supporting one end portion of the probe in the insulating member through the probe accommodating hole is conducted in a state in which the insulating member and the base member are combined.

18. A test socket fabricated by the method of claim 17.

* * * * *